US012575055B2

(12) United States Patent
Yosho et al.

(10) Patent No.: US 12,575,055 B2
(45) Date of Patent: Mar. 10, 2026

(54) HEAT DISSIPATING STRUCTURE, AND ELECTRONIC DEVICE

(71) Applicant: Panasonic Intellectual Property Management Co., Ltd., Osaka (JP)

(72) Inventors: Hiroki Yosho, Osaka (JP); Hiroki Kamezaki, Osaka (JP); Junichi Hasegawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 196 days.

(21) Appl. No.: 18/389,085

(22) Filed: Nov. 13, 2023

(65) Prior Publication Data

US 2024/0081018 A1 Mar. 7, 2024

Related U.S. Application Data

(63) Continuation of application No. PCT/JP2022/019795, filed on May 10, 2022.

(30) Foreign Application Priority Data

May 26, 2021 (JP) ................................. 2021-088503

(51) Int. Cl.
*H05K 7/20* (2006.01)
*G06F 1/20* (2006.01)

(52) U.S. Cl.
CPC ......... *H05K 7/20154* (2013.01); *G06F 1/203* (2013.01); *H05K 7/20145* (2013.01)

(58) Field of Classification Search
CPC ............ H05K 7/20154; H05K 7/20145; G06F 1/203; G06F 1/20; H01L 23/467
See application file for complete search history.

(56) References Cited

U.S. PATENT DOCUMENTS 3,635,305 A * 1/1972 Kunishi ................. B60K 37/20
180/90
7,952,872 B1 * 5/2011 Hata ..................... H01L 23/427
361/679.48
(Continued)

FOREIGN PATENT DOCUMENTS

JP 2006-292269 A 10/2006
JP 4144037 B2 * 9/2008
(Continued)

OTHER PUBLICATIONS

Kobayashi Takashi et al., "Cooling Device and Heat Sink", Jun. 8, 2006, Toshiba Home Tech Corp., Entire Document (Translation of JP 4144037). (Year: 2006).*

(Continued)

*Primary Examiner* — Stephen S Sul
(74) *Attorney, Agent, or Firm* — Renner, Otto, Boisselle & Sklar, LLP

(57) ABSTRACT

A heat dissipating structure of the present disclosure is a heat dissipating structure provided inside a housing, the heat dissipating structure including: a blower that blows air; a heat dissipator including a heat dissipating blow passage through which air from the blower flows; a heat transmitter arranged on the heat dissipator and transferring heat generated by a heat source to the heat dissipator; and a branch blow passage provided between the housing and the heat transmitter and branching from the heat dissipating blow passage. The heat dissipating blow passage includes a branch inlet positioned between the heat transmitter and the blower. The branch blow passage branches from the branch inlet of the heat dissipating blow passage.

8 Claims, 9 Drawing Sheets

(56) References Cited

U.S. PATENT DOCUMENTS

| | | | | |
|---|---|---|---|---|
| 9,237,675 | B2 * | 1/2016 | Iwata | G06F 1/203 |
| 10,831,247 | B2 * | 11/2020 | Uchino | F28F 3/025 |
| 11,078,927 | B2 * | 8/2021 | Watanabe | H05K 7/20172 |
| 11,477,911 | B1 * | 10/2022 | He | H01L 23/427 |
| 11,758,685 | B2 * | 9/2023 | North | H05K 7/20554 |
| | | | | 361/695 |
| 2010/0091251 | A1 * | 4/2010 | Fujibayashi | G03B 21/16 |
| | | | | 353/56 |
| 2011/0249401 | A1 * | 10/2011 | Yamaguchi | H05K 7/2029 |
| | | | | 165/104.21 |
| 2011/0267777 | A1 * | 11/2011 | Oike | H01L 23/467 |
| | | | | 361/697 |
| 2013/0025831 | A1 * | 1/2013 | Attinger | F28F 13/06 |
| | | | | 165/104.27 |
| 2014/0290908 | A1 * | 10/2014 | Wang | H01L 23/34 |
| | | | | 165/80.2 |
| 2015/0062805 | A1 * | 3/2015 | Katsumata | F28F 13/06 |
| | | | | 361/679.49 |
| 2016/0027718 | A1 * | 1/2016 | Park | H10K 59/8794 |
| | | | | 165/80.3 |

FOREIGN PATENT DOCUMENTS

| | | |
|---|---|---|
| JP | 2010-139635 A | 6/2010 |
| JP | 2010-201147 A | 9/2010 |
| JP | 2014-038924 A | 2/2014 |
| WO | 2003/067949 A1 | 8/2003 |

OTHER PUBLICATIONS

International Search Report for corresponding Application No. PCT/JP2022/019795, mailed Jul. 26, 2022.

* cited by examiner

HEAT DISSIPATING STRUCTURE, AND ELECTRONIC DEVICE

BACKGROUND

1. Technical Field

The present disclosure relates to a heat dissipating structure and an electronic device including the heat dissipating structure.

2. Description of the Related Art

Patent Literature (PTL) 1 discloses a heat dissipating device including a case, a heat receiving material, a heat insulating material, and a heat diffusing material. In the heat dissipating device described in PTL 1, the heat insulating material is provided in contact with the heat receiving material, and prevent transmission of the heat received by the heat receiving material. The heat diffusing material is provided in contact with both the case and the heat insulating material, receives heat from the heat insulating material, and diffuses the received heat into the case.

PTL 1 is Unexamined Japanese Patent Publication No. 2010-139635.

SUMMARY

An object of the present disclosure is to provide a heat dissipating structure that suppresses heat transmission to a housing and an electronic device including the heat dissipating structure.

A heat dissipating structure of one aspect of the present disclosure is a heat dissipating structure provided inside a housing, the heat dissipating structure including: a blower that blows air; a heat dissipator including a heat dissipating blow passage through which air from the blower flows; a heat transmitter arranged on the heat dissipator and transferring heat generated by a heat source to the heat dissipator; and a branch blow passage provided between the housing and the heat transmitter and branching from the heat dissipating blow passage.

The heat dissipating blow passage includes a branch inlet positioned between the heat transmitter and the blower.

The branch blow passage branches from the branch inlet of the heat dissipating blow passage.

An electronic device of one aspect of the present disclosure includes the heat dissipating structure and the housing.

According to the present disclosure, it is possible to provide a heat dissipating structure that suppresses heat transmission to a housing and an electronic device including the heat dissipating structure.

BRIEF DESCRIPTION OF THE DRAWINGS

FIG. 4 is a front view of the second housing illustrated in FIG. 3.

FIG. 8 is a schematic longitudinal cross-sectional view explaining a heat dissipating structure of a second exemplary embodiment according to the present disclosure.

FIG. 9 is a schematic longitudinal cross-sectional view explaining a heat dissipating structure of a third exemplary embodiment according to the present disclosure.

DETAILED DESCRIPTION

Background of Present Disclosure

Figure 1:
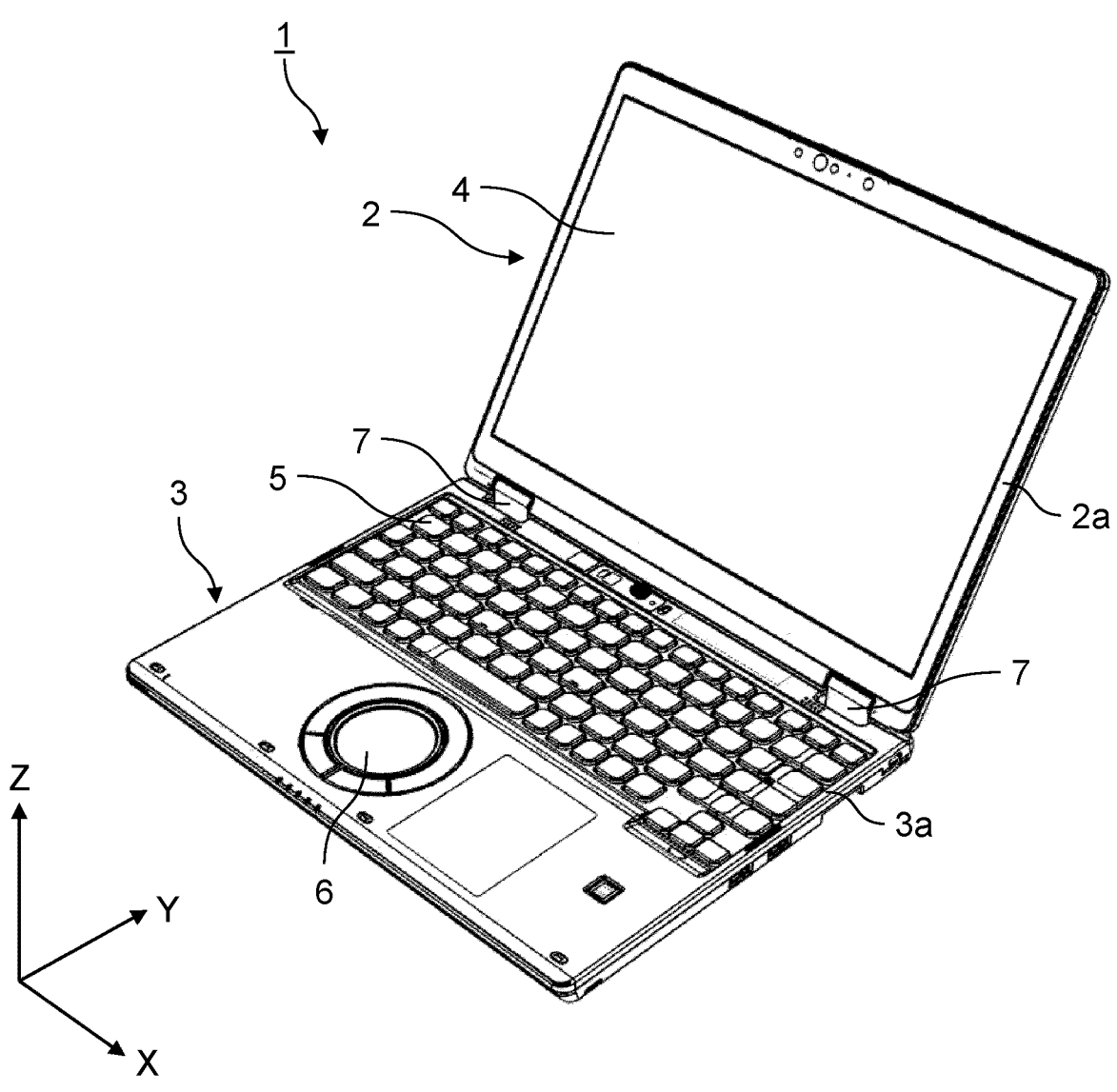
FIG. 1 is a schematic perspective view of an example of an electronic device according to a first exemplary embodiment according to the present disclosure.

Examples of the electronic device include a laptop computer (notebook PC). A laptop computer includes a first housing having a display, a second housing having an inputter, and a hinge rotatably connecting the first housing and the second housing. In the laptop computer, the first housing and the second housing rotate, and the display and the inputter are arranged at positions facing each other.

In an electronic device such as a laptop computer, various electronic components are accommodated in a housing. In recent years, with an advance in performance of electronic devices, a load on an electronic component tends to increase, and an amount of heat generation from the electronic component tends to increase. Therefore, a heat dissipating structure that dissipates heat generated from the electronic component to the outside of the housing as quickly as possible is incorporated in the housing. In the heat dissipating structure, for example, heat generated from the electronic component is transmitted to a heat dissipator via a heat transmitter, air from a blower is blown to the heat dissipator to perform heat exchange, and the heated air is exhausted from an exhaust port of the housing. It has been studied to arrange, between the housing and the heat transmitter, a regulator that regulates backflow of the heated air into the housing through a gap between an inner wall of the housing and a heat transmitter. However, the regulator is in contact with the inner wall of the housing and the heat transmitter, and therefore the heat from the heat transmitter is transmitted to the housing via the regulator, whereby the housing may have a high temperature.

Therefore, the present inventors have found a heat dissipating structure that suppresses heat transmission to the housing, and have reached the following invention.

A heat dissipating structure of a first aspect of the present disclosure is a heat dissipating structure provided inside a housing, the heat dissipating structure including: a blower that blows air; a heat dissipator having a heat dissipating blow passage through which air from the blower flows; a heat transmitter arranged on the heat dissipator and transferring heat generated by a heat source to the heat dissipator; and a branch blow passage provided between the housing and the heat transmitter and branching from the heat dissipating blow passage, in which the heat dissipator is formed with a branch inlet that branches from the heat dissipating blow passage to the branch blow passage on a side of the blower relative to the heat transmitter.

Such configuration can suppress heat transmission to the housing.

In a heat dissipating structure of a second aspect of the present disclosure, the heat dissipating structure may further include a branch regulator regulating a flow of air flowing through the branch blow passage on a side of the blower at the branch inlet.

Such configuration can regulate backflow of air in the housing.

In a heat dissipating structure of a third aspect of the present disclosure, the branch regulator may have a heat insulating property.

Such configuration can suppress heat transmission through the branch regulator.

In a heat dissipating structure of a fourth aspect of the present disclosure, the heat dissipator includes a plurality of fins arranged apart in a direction intersecting with an extending direction of the heat dissipating blow passage, and the plurality of fins at the branch inlet may have an inclined shape where a space with respect to the housing gradually increases from a side of the blower to an opposite side of the blower.

Such configuration expands a branch space at the branch inlet, and thus it becomes easy to guide air to the branch blow passage.

In a heat dissipating structure of a fifth aspect of the present disclosure, an opposite-side gap is formed between the housing and the heat dissipator on an opposite side to a side where the heat transmitter is arranged, and the heat dissipating structure may further include an opposite-side regulator regulating a flow of air flowing through the opposite-side gap.

Such configuration can regulate backflow of air in the housing.

An electronic device of a sixth aspect of the present disclosure includes the above-described heat dissipating structure.

Such configuration can suppress heat transmission to the housing in the electronic device.

Hereinafter, exemplary embodiments of the present disclosure will be described with reference to the accompanying drawings. In each drawing, each element is exaggerated for ease of description. Note that an X direction, a Y direction, and a Z direction in the drawings indicate a width direction, a depth direction, and a height direction of electronic device 1, respectively.

First Exemplary Embodiment

[Electronic Device]

FIG. 1 is a schematic perspective view of an example of electronic device 1 according to the first exemplary embodiment according to the present disclosure.

As illustrated in FIG. 1, electronic device 1 is, for example, a laptop computer (notebook PC). Electronic device 1 includes first housing 2 and second housing 3. Each of first housing 2 and second housing 3 has a thin box-shaped outer shell, and has a rectangular shape in plan view.

First housing 2 houses display panel 4 as a display. Display panel 4 is, for example, a liquid crystal panel or an organic EL panel. The outer periphery of display panel 4 is covered with first frame 2a of first housing 2. First frame 2a is only required to cover at least both side ends of display panel 4.

Second housing 3 houses keyboard 5 and touch pad 6 that serve as inputters. The outer periphery of keyboard 5 is covered with second upper housing 3a of second housing 3. Touch pad 6 is provided on a front side of keyboard 5 as viewed from the user. The user can move a cursor or scroll display panel 4 by tracing touch pad 6 with a finger.

For example, a rechargeable battery, a hard disk drive (HDD) that is a main recording device, other devices, and the like, all of which are not illustrated, are arranged inside second housing 3. Note that electronic device 1 can include, for example, an antenna module for wireless LAN communication, a disc drive compatible with a Blu-ray disc or a DVD disc, a webcam element, a voice microphone, a speaker, and other various input and output terminals. However, since these functions and shapes have been conventionally known, illustration and detailed description thereof are omitted.

First housing 2 and second housing 3 are connected via hinge 7. Hinge 7 rotatably connects first housing 2 and second housing 3. Hinge 7 allows first housing 2 and/or second housing 3 to rotate and bring electronic device 1 into an open state or a closed state. Note that the "open state" means a state where first housing 2 and second housing 3 are separated from each other, and display panel 4, keyboard 5, and touch pad 6 are exposed. The "close state" means a state where first housing 2 and second housing 3 are at positions facing each other, display panel 4 faces keyboard 5 and touch pad 6, and display panel 4, keyboard 5, and touch pad 6 are not exposed.

Figure 2:
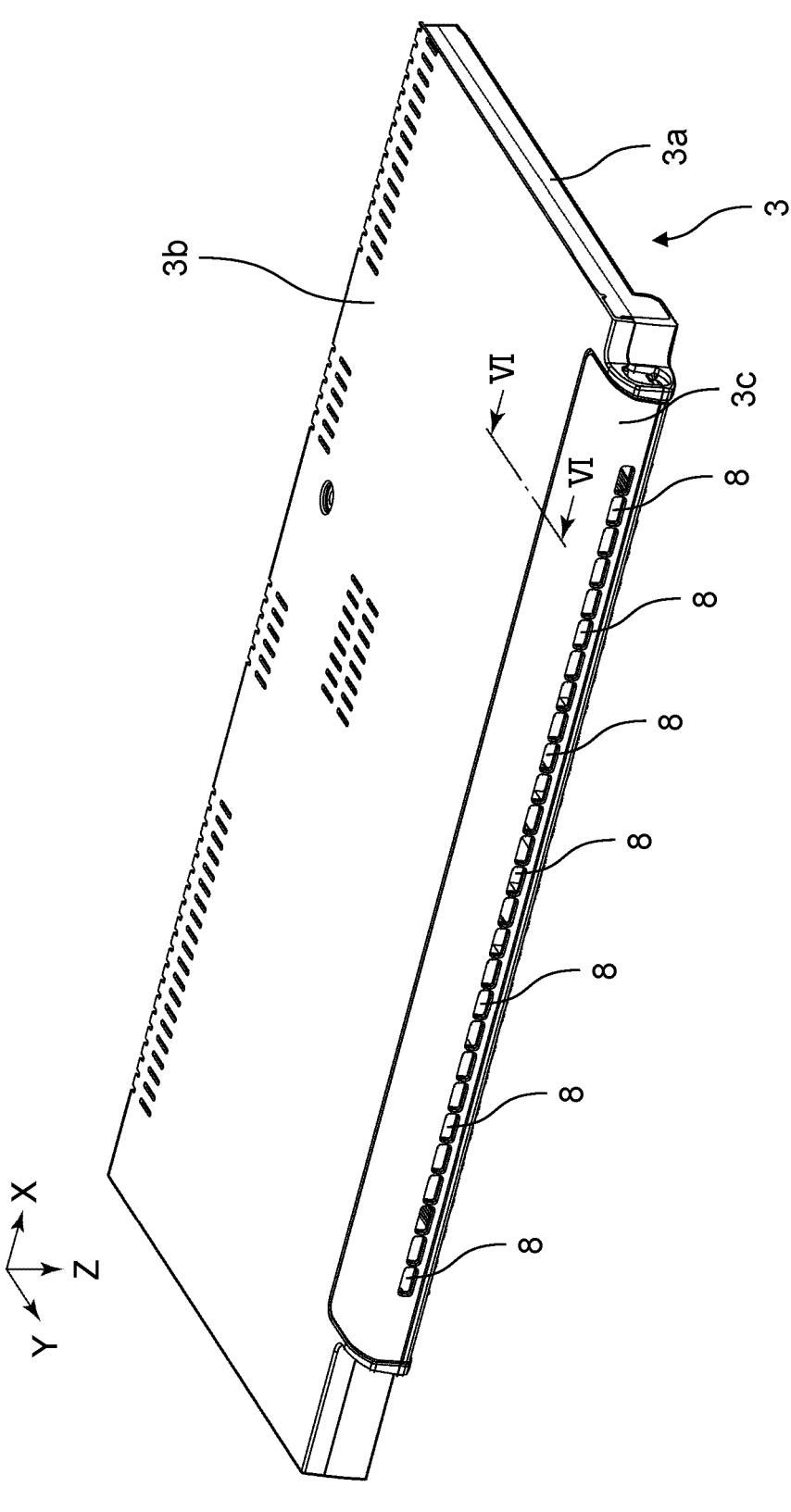
FIG. 2 is a perspective view of a part of a second housing of the electronic device illustrated in FIG. 1 as viewed from a back surface side.

FIG. 2 is a perspective view of a part of second housing 3 of electronic device 1 illustrated in FIG. 1 as viewed from a back surface side (bottom surface side).

Second housing 3 includes second upper housing 3a, second lower housing 3b, and exhaust cover 3c. Exhaust cover 3c is positioned on a side of hinge 7 and connects second upper housing 3a and second lower housing 3b. A side part and a bottom part of second housing 3 are provided with a plurality of exhaust ports 8. The plurality of exhaust ports 8 communicate with an opening formed in a side part of exhaust cover 3c.

Figure 3:
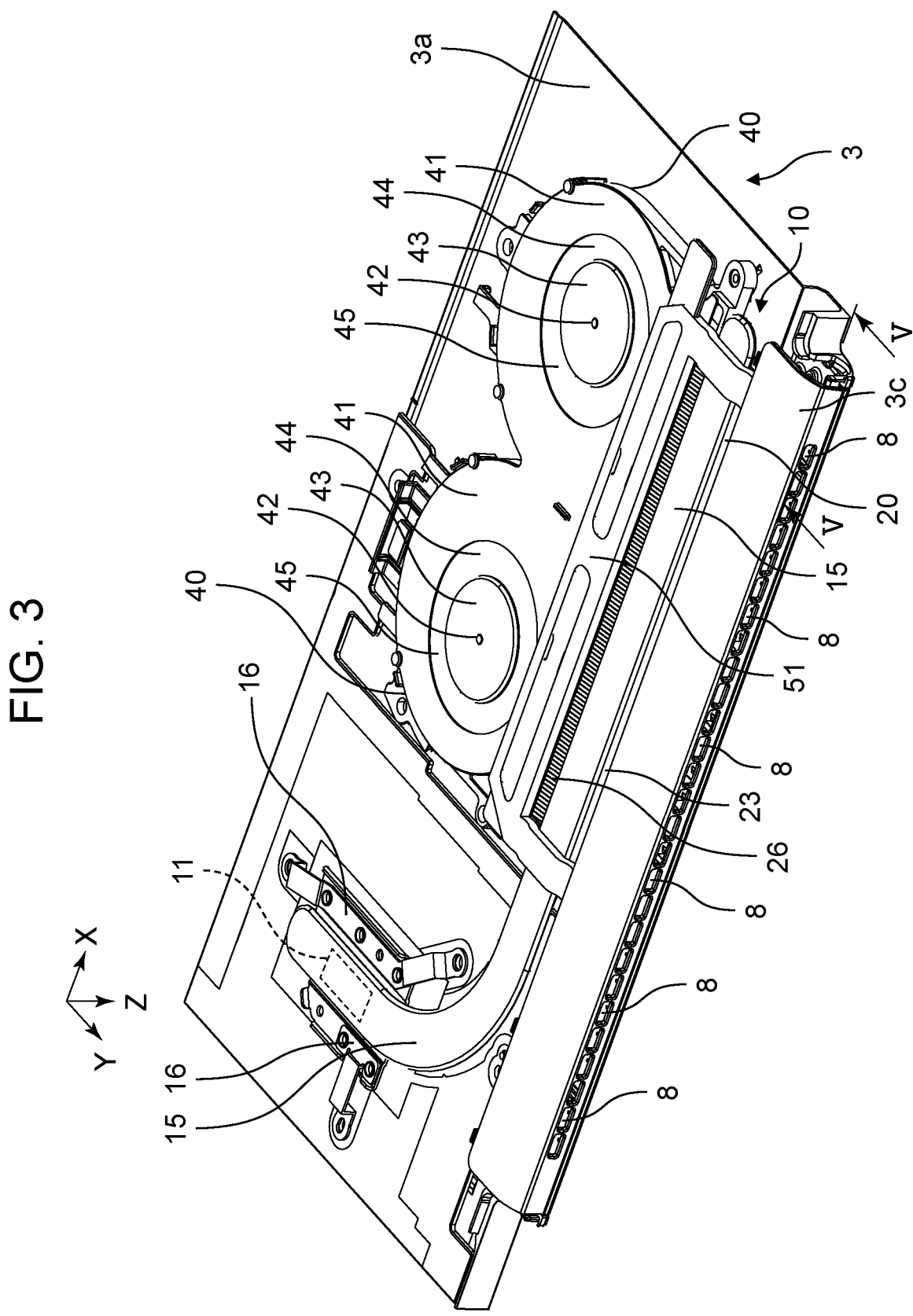
FIG. 3 is a perspective view of a state where illustration of a second lower housing is omitted from the part of the second housing illustrated in FIG. 2.
Figure 4:
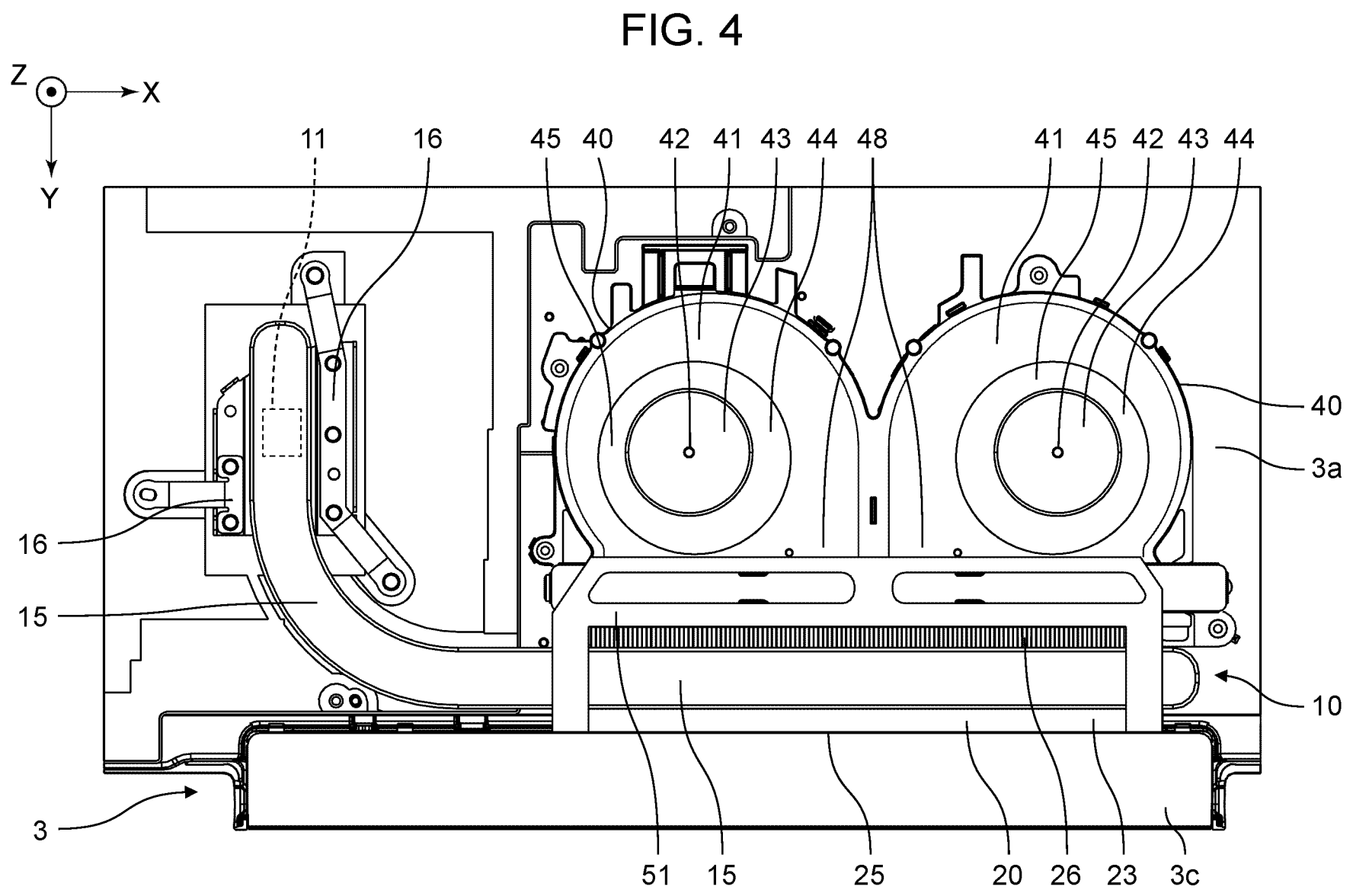
Figure 5:
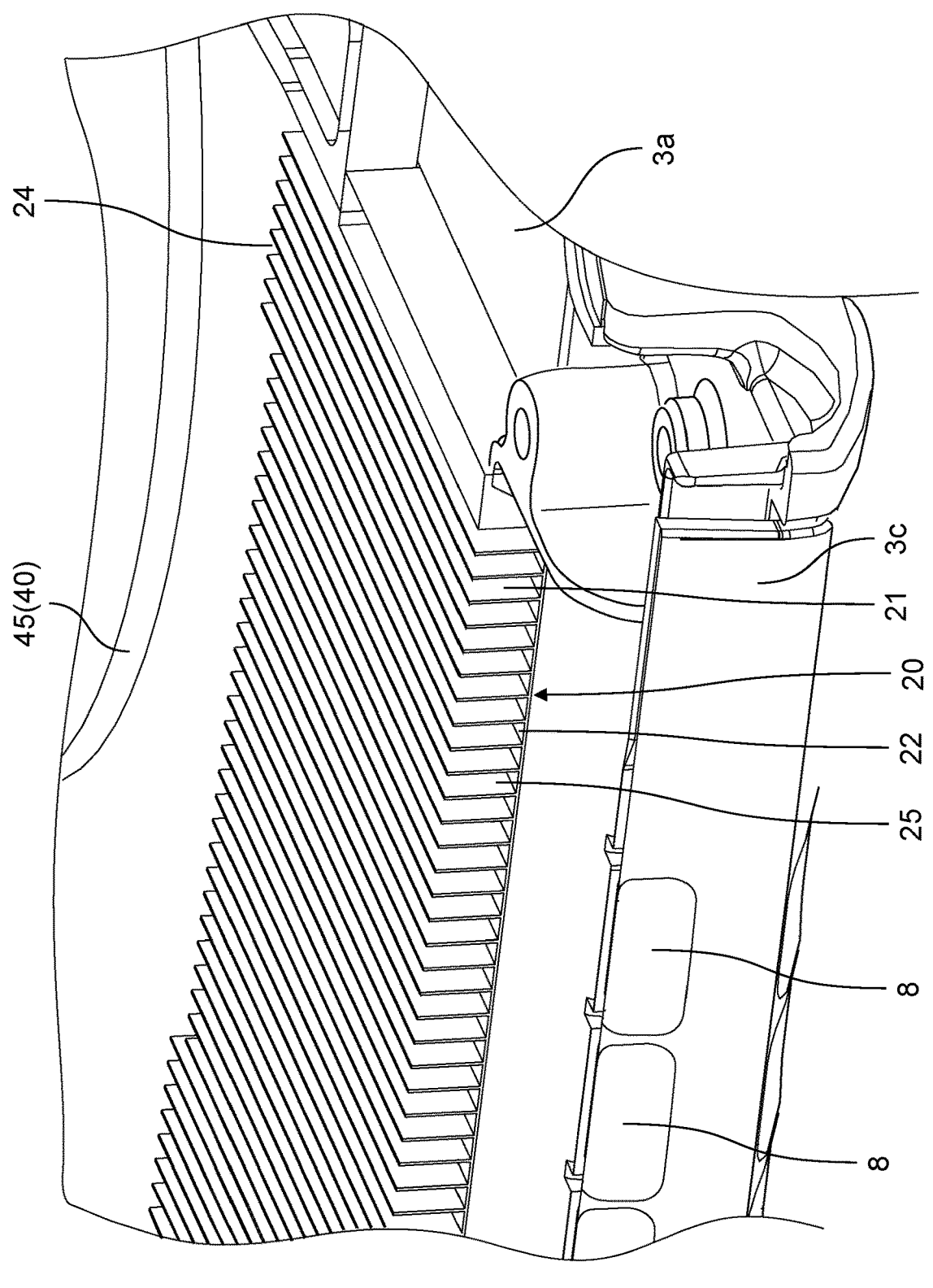
FIG. 5 is a transverse cross-sectional view of a main part of the second housing illustrated in FIG. 3 cut along line V-V.
Figure 6:
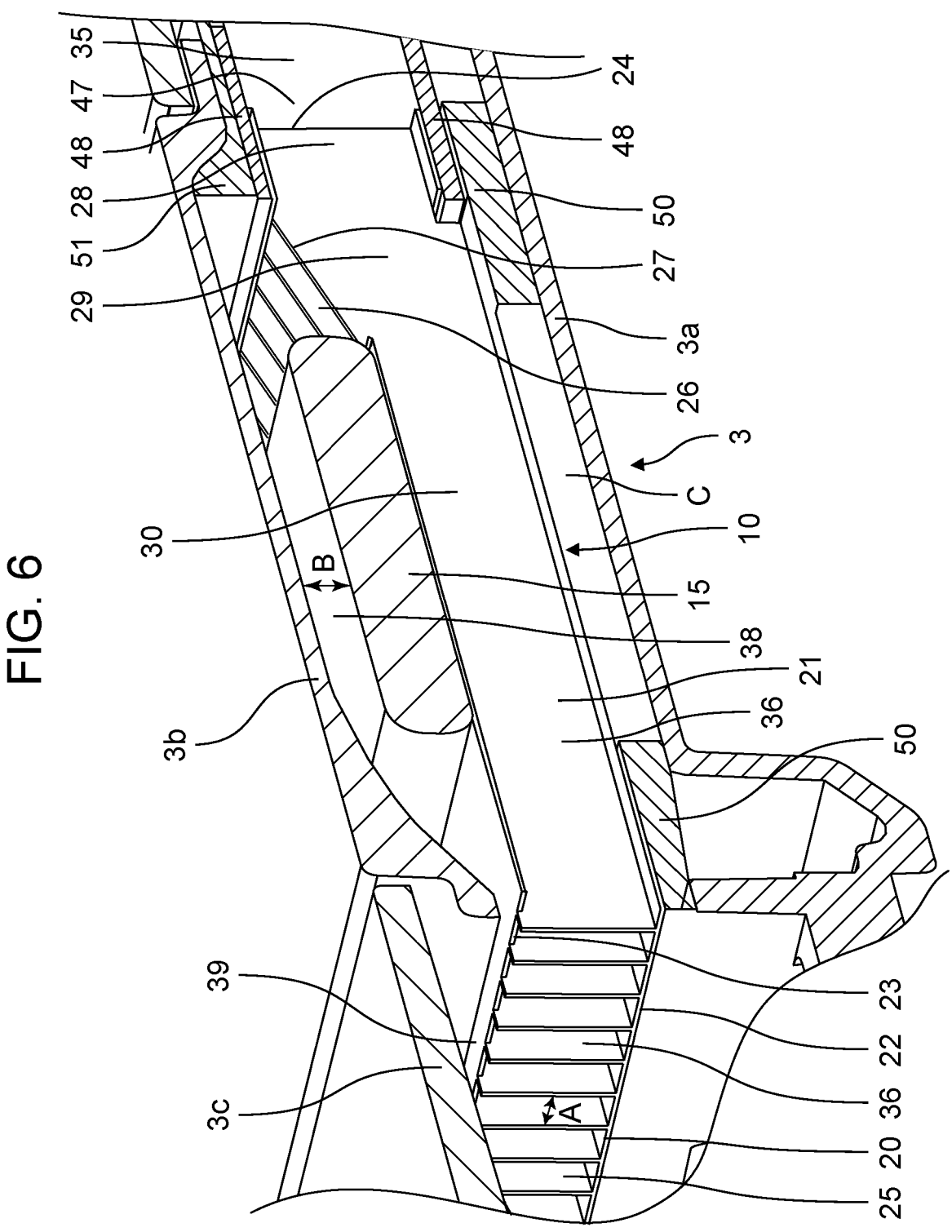
FIG. 6 is a longitudinal cross-sectional view of a main part of the part of the second housing illustrated in FIG. 2 cut along line VI-VI.
Figure 7:
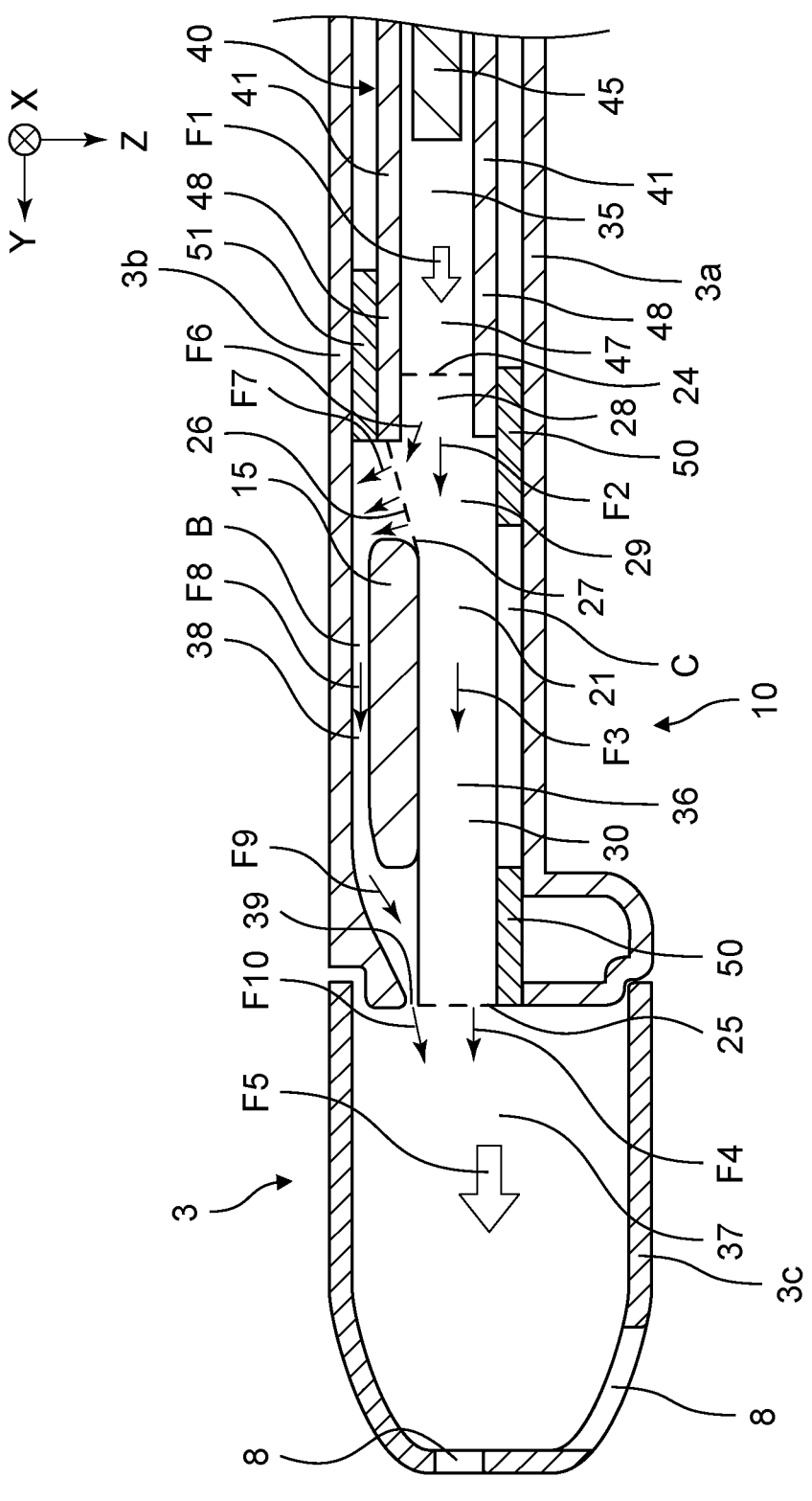
FIG. 7 is a schematic longitudinal cross-sectional view explaining a heat dissipating structure of the first exemplary embodiment according to the present disclosure.

FIG. 3 is a perspective view of a state where illustration of a second lower housing 3b is omitted from the part of second housing 3 illustrated in FIG. 2. FIG. 4 is a front view of second housing 3 illustrated in FIG. 3. FIG. 5 is a transverse cross-sectional view of a main part of second housing 3 illustrated in FIG. 3 cut along line V-V. FIG. 6 is a longitudinal cross-sectional view of a main part of the part of second housing 3 illustrated in FIG. 2 cut along line VI-VI. FIG. 7 is a schematic longitudinal cross-sectional view explaining heat dissipating structure 10 of the first exemplary embodiment according to the present disclosure.

As illustrated in FIGS. 3 and 4, heat dissipating structure 10 is arranged inside second housing (housing) 3. Heat dissipating structure 10 includes heat transmitter 15, heat dissipator 20, and blower 40. Heat dissipating structure 10 dissipates heat generated by heat source 11 arranged inside housing 3.

Heat source 11 is a device that generates a large amount of heat by operation. Heat source 11 is, for example, a central processing unit (CPU).

Heat transmitter 15 serves to transmit, to heat dissipator 20, heat generated from heat source 11. Heat transmitter 15 is arranged on heat dissipator 20, and is fixed to and thermally connected to second wall 23 of heat dissipator 20. Heat transmitter 15 is a hollow heat pipe or a solid heat pipe made of metal having high heat conductivity such as copper or aluminum, for example. Heat transmitter 15 has, for example, a flat track shape in the Y-Z cross section. One side of heat transmitter 15 is arranged in close contact with heat source 11 or via another heat conductive member, and is thermally connected by being pressed against heat source 11 by pressing member 16. The other side of heat transmitter 15 is arranged in close contact with heat dissipator 20 or via another heat conductive member. The other side of heat transmitter 15 is thermally connected to heat dissipator 20 by being fixed to heat dissipator 20 by, for example, brazing or soldering.

Heat dissipator 20 serves to dissipate heat by exchanging heat with air blown from blower 40. Heat dissipator 20 is, for example, a heat sink where a plurality of thin plate-shaped fins or needle-shaped bodies made of metal having high heat conductivity such as copper or aluminum are arrayed. As illustrated in FIG. 3, in heat dissipator 20, for example, a plurality of fins 21 extend along the Y-Z plane and are arrayed apart from one another in a direction (e.g., the X axis direction) intersecting an extending direction (e.g., the Y axis direction) of heat dissipating blow passage 36 described later.

Fin 21 of heat dissipator 20 has introduction part 28, intermediate part 29, and straight part 30. Introduction part 28 is positioned on the side of blower 40 and has a rectangular shape. Introduction part 28 is attached to, for example, duct 48 of blower 40. Straight part 30 is positioned on a side of second upper housing 3a relative to introduction part 28 and has a rectangular shape extending straight in the Y axis direction. Intermediate part 29 extends so as to connect introduction part 28 and straight part 30, and has a trapezoidal shape, for example.

Blower 40 serves to blow air toward heat dissipator 20. Blower 40 is, for example, a centrifugal cooling fan that sends air in a centrifugal direction. As illustrated in FIGS. 3, 4, and 6, blower 40 includes fan case 41, rotation shaft 42, motor 43, blade 45, suction port 44, inlet blow passage 35, blower port 47, and duct 48. Fan case 41 of blower 40 has duct 48 on the side of blower port 47. In blower 40, for example, two pairs of blades 45, rotation shaft 42, and motor 43 are arrayed in the X axis direction. As illustrated in FIGS. 6 and 7, introduction part 28 of heat dissipator 20 is configured to be attached to and held by duct 48.

In blower 40, blades 45 accommodated inside fan case 41 rotates about rotation shaft 42 by motor 43. Due to this, blade 45 takes in surrounding air from suction port 44 formed on an upper surface and/or a lower surface of fan case 41, and blows out air from blower port 47 provided in duct 48. Air blown out from blower port 47 of duct 48 is supplied to heat dissipation inlet 24 of heat dissipator 20.

As illustrated in FIG. 6, heat dissipator 20 has first wall 22 on a side of second upper housing 3a. The side of second upper housing 3a of heat dissipator 20 is closed by first wall 22. Opposite-side gap C is formed between second upper housing 3a and heat dissipator 20 on an opposite side to the side where heat transmitter 15 is arranged. Opposite-side regulator 50 is arranged in opposite-side gap C. In other words, first wall 22 of heat dissipator 20 is separated from second upper housing 3a via opposite-side regulator 50 arranged in opposite-side gap C.

Opposite-side regulator 50 serves to regulate the flow of air flowing through opposite-side gap C. This can regulate backflow of air in second housing 3. Opposite-side regulator 50 is a foam of an organic material having a shielding property and a heat insulating property (low heat conductivity). Opposite-side regulator 50 is, for example, a sponge made of melanin resin.

As illustrated in FIG. 6, heat dissipator 20 has second wall 23 on a side of second lower housing 3b. Second wall 23 is arranged between the plurality of fins 21 and heat transmitter 15. Heat dissipator 20 has branch inlet 26 where second wall 23 is partially opened on the side of second lower housing

3b. In other words, the side of second lower housing 3b of heat dissipator 20 is closed by second wall 23 except for branch inlet 26. Branch inlet 26 is formed by exposing fin 21 with the arrangement of second wall 23 partially omitted.

Second wall 23 of heat dissipator 20 is separated from second lower housing 3b, and in a site where heat transmitter 15 is arranged, branch gap B is formed between heat transmitter 15 and second lower housing 3b.

Heat dissipator 20 has heat dissipation inlet 24 on the side of blower 40 and heat dissipation outlet 25 on the side of exhaust port 8. Heat dissipator 20 has heat dissipating blow passage 36 through which air from blower 40 flows. Heat dissipating blow passage 36 is formed by a space surrounded by two fins 21 and 21 adjacent to each other, first wall 22, second wall 23, heat dissipation inlet 24, and heat dissipation outlet 25. In heat dissipating blow passage 36, air from blower 40 flows in through heat dissipation inlet 24 and exchanges heat with fins 21. Then, the air heated by the heat exchange flows out from heat dissipation outlet 25.

Heat dissipating structure 10 of the first exemplary embodiment will be described in detail with reference to FIGS. 6 and 7. In FIG. 7, heat dissipation inlet 24, heat dissipation outlet 25, and branch inlet 26 are indicated by dotted lines, and it is indicated that air can circulate in the parts indicated by these dotted lines. An arrow in FIG. 7 schematically indicates a flow of air such as first blow F1.

In heat dissipator 20, two fins 21 and 21 adjacent to each other are separated from each other by fin gap A in the X axis direction. Heat dissipating blow passage 36 is formed by the plurality of adjacent fins 21. In heat dissipating blow passage 36, air is blown from inlet blow passage 35 of blower 40 toward exhaust port 8 via outlet blow passage 37. This cools fins 21.

Fins 21 of heat dissipator 20 and heat transmitter 15 are each separated from second lower housing 3b. Branch blow passage 38 is formed by the separated space. Branch blow passage 38 is provided between heat transmitter 15 and second lower housing 3b and branches from heat dissipating blow passage 36. Branch gap B is formed between heat transmitter 15 and second lower housing 3b in branch blow passage 38. In other words, in branch blow passage 38, a surface on the side of second lower housing 3b of heat transmitter 15 and an inner surface of second lower housing 3b are separated from each other by branch gap B in the Z axis direction. For example, dimensions can be configured such that the separation distance of fin gap A becomes smaller than the separation distance of branch gap B. That is, the distance between the first fin and the second fin adjacent to each other among the plurality of fins 21 (the separation distance of fin gap A) may be smaller than the distance between second lower housing 3b and heat transmitter 15 (the separation distance of branch gap B). This makes it easy for air to circulate through branch blow passage 38, and makes it possible to suppress heat from heat transmitter 15 from being transmitted to second lower housing 3b.

Branch inlet 26 branching from heat dissipating blow passage 36 to branch blow passage 38 is formed on the side of blower 40 relative to heat transmitter 15 in heat dissipator 20. In other words, branch inlet 26 is arranged on intermediate part 29 of heat dissipator 20 and on the side facing second lower housing 3b. Branch inlet 26 is formed by exposing fin 21 with the arrangement of second wall 23 partially omitted. That is, as illustrated in FIG. 7, branch inlet 26 is positioned between heat transmitter 15 and blower 40. Branch blow passage 38 branches from branch inlet 26 of heat dissipating blow passage 36.

Branch regulator 51 is arranged in introduction part 28 positioned on the side of blower 40 relative to branch inlet 26. Branch regulator 51 is arranged in a gap formed between duct 48 of fan case 41 and second lower housing 3*b*. That is, as illustrated in FIG. 7, branch regulator 51 is arranged between branch inlet 26 and blower 40. Branch regulator 51 serves to regulate the flow of air flowing through branch blow passage 38 on the side of blower 40 of branch inlet 26. This can regulate backflow of air in second housing 3. As branch regulator 51, a foam of an organic material having a shielding property and a heat insulating property (low heat conductivity) can be used. Branch regulator 51 is, for example, a sponge made of melanin resin.

Heat transmitter 15 is positioned on a side of exhaust port 8 relative to branch inlet 26. Heat transmitter 15 is thermally connected to second wall 23 of fin 21. Branch outlet 39 is formed between an end on a side of exhaust port 8 of straight part 30 and second lower housing 3*b*.

Branch blow passage 38 is formed by a space surrounded by second lower housing 3*b*, heat transmitter 15, second wall 23, branch inlet 26, and branch outlet 39. In branch blow passage 38, the air having circulated through introduction part 28 in heat dissipating blow passage 36 flows in from branch inlet 26 and circulates through branch gap B to perform heat exchange. The air heated by the heat exchange flows out from branch outlet 39. The air heated by having circulated through branch blow passage 38 joins with the heated air circulating through heat dissipating blow passage 36 and circulates through outlet blow passage 37.

Inlet blow passage 35 in blower 40 is continuous to heat dissipating blow passage 36 of heat dissipator 20. Heat dissipating blow passage 36 is branched into branch blow passage 38 at branch inlet 26. Branch blow passage 38 having been branched joins heat dissipating blow passage 36 at branch outlet 39. Heat dissipating blow passage 36 having been joined and branch blow passage 38 constitute outlet blow passage 37.

Inlet blow passage 35 is formed in duct 48 of blower 40, and connects from blade 45 of blower 40 to heat dissipation inlet 24 of heat dissipator 20. In inlet blow passage 35, first blow F1 circulates. Heat dissipating blow passage 36 is formed in fin 21 of heat dissipator 20, and connects from heat dissipation inlet 24 to heat dissipation outlet 25. In heat dissipating blow passage 36, second blow F2 and third blow F3 circulate, whereby heat exchange is performed and air is heated.

Branch blow passage 38 is formed in a gap between fin 21 and second lower housing 3*b*, and is formed in a gap between heat transmitter 15 and second lower housing 3*b*. Branch blow passage 38 connects from branch inlet 26 to branch outlet 39. Sixth blow F6 branched from first blow F1 in heat dissipating blow passage 36 flows in as seventh blow F7 in branch blow passage 38 through branch inlet 26. In branch blow passage 38, seventh blow F7, eighth blow F8, and ninth blow F9 circulate, whereby heat exchange is performed and air is heated. Ninth blow F9 having been heated flows out as tenth blow F10 in outlet blow passage 37 through branch outlet 39. Due to this, since sixth blow F6 branched from first blow F1 circulates through branch blow passage 38, the heat from heat transmitter 15 can be suppressed from being transmitted to second lower housing 3*b*.

Outlet blow passage 37 is formed inside exhaust cover 3*c* and connects from heat dissipation outlet 25 and branch outlet 39 to exhaust port 8. In outlet blow passage 37, tenth blow F10 to which fourth blow F4 and fifth blow F5 having been heated join circulates and is exhausted from exhaust port 8.

As illustrated in FIG. 7, intermediate part 29 of fin 21 in heat dissipator 20 has inclination 27 on the side of second lower housing 3*b*. Inclination 27 has an inclined shape where a space with respect to second lower housing 3*b* gradually increases from the side of blower 40 to the opposite side of blower 40. That is, as illustrated in FIG. 6, inclination 27 of fin 21 is configured such that the space between inclination 27 of fin 21 and second lower housing 3*b* gradually increases from blower 40 toward heat transmitter 15. The inclined shape of branch inlet 26 directs, toward branch blow passage 38, air flowing in through branch inlet 26. The inclined shape of branch inlet 26 can widen a branch space formed on an upstream side of branch inlet 26 and reduce pressure loss as compared with a case of not having the inclined shape. This makes it easy to guide air to branch blow passage 38.

Second Exemplary Embodiment

Figure 8:
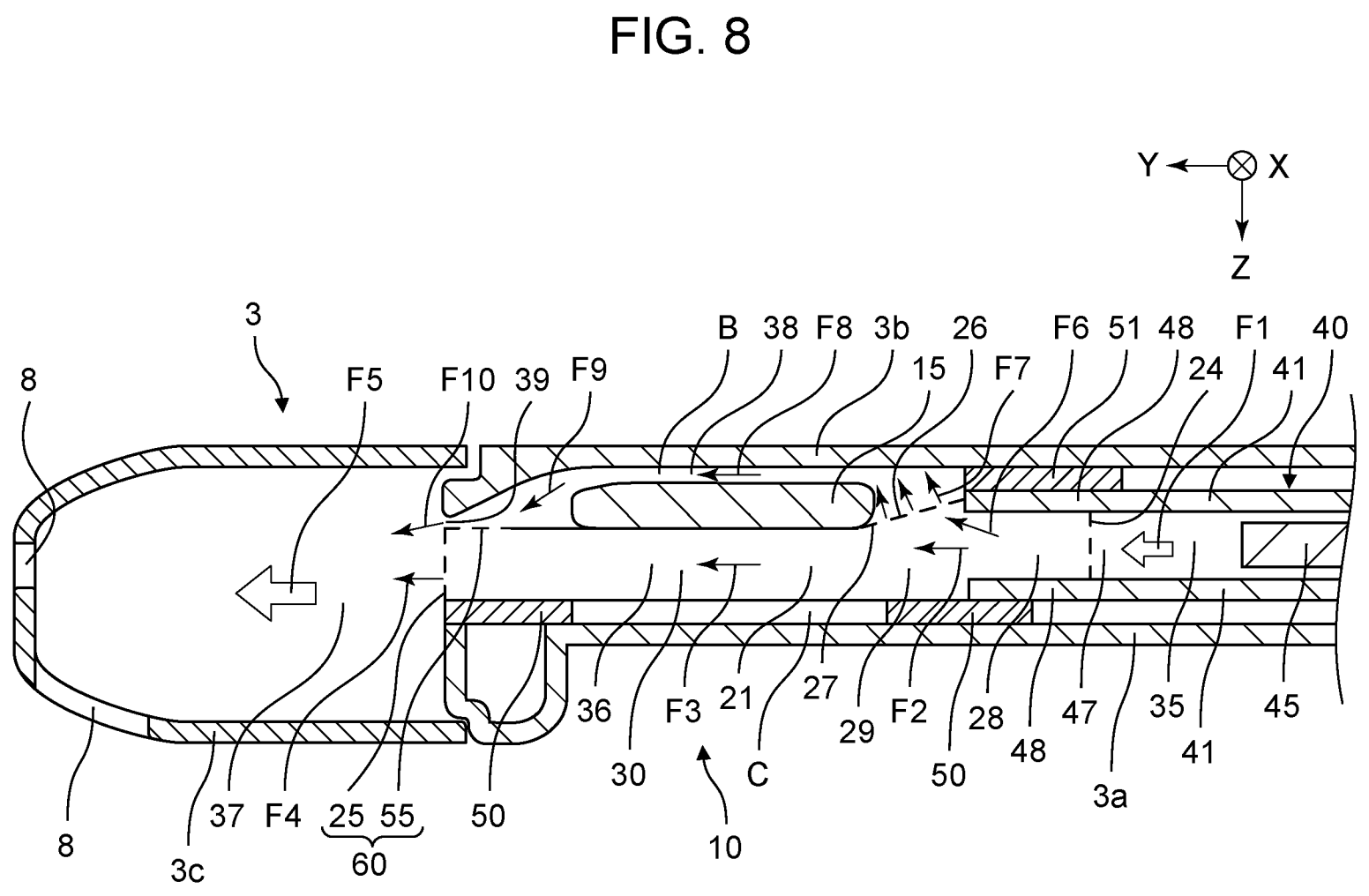

Heat dissipating structure 10 of the second exemplary embodiment will be described in detail with reference to FIG. 8. FIG. 8 is a schematic longitudinal cross-sectional view explaining heat dissipating structure 10 of the second exemplary embodiment according to the present disclosure. In FIG. 8, heat dissipation inlet 24, heat dissipation outlet 25, branch inlet 26, and additional outlet 55 are indicated by dotted lines. These parts in dotted lines indicate that air can circulate. An arrow in FIG. 8 schematically indicates a flow of air such as first blow F1. Heat dissipating structure 10 of the second exemplary embodiment is different from heat dissipating structure 10 of the first exemplary embodiment in that additional outlet 55 is formed so as to communicate with heat dissipation outlet 25.

Additional outlet 55 is formed at a terminal on a side of exhaust port 8 in straight part 30 of fin 21 in heat dissipator 20 and on a side facing second lower housing 3*b*. Additional outlet 55 is formed by exposing fin 21 with the arrangement of second wall 23 partially omitted. Additional outlet 55 communicates with heat dissipation outlet 25 to form junction outlet 60 integrally opening. Ninth blow F9 flows in heat dissipating blow passage 36 through additional outlet 55, and then flows out to outlet blow passage 37 through branch outlet 39 and junction outlet 60.

In heat dissipating structure 10 of the first exemplary embodiment, ninth blow F9 having circulated through branch blow passage 38 flows out through branch outlet 39. On the other hand, in heat dissipating structure 10 of the second exemplary embodiment, ninth blow F9 flows out through branch outlet 39 and junction outlet 60. Therefore, the heat transmission to second lower housing 3*b* is suppressed by branch blow passage 38, and the air having been circulated through branch blow passage 38 smoothly flows out by additional outlet 55.

Third Exemplary Embodiment

Figure 9:
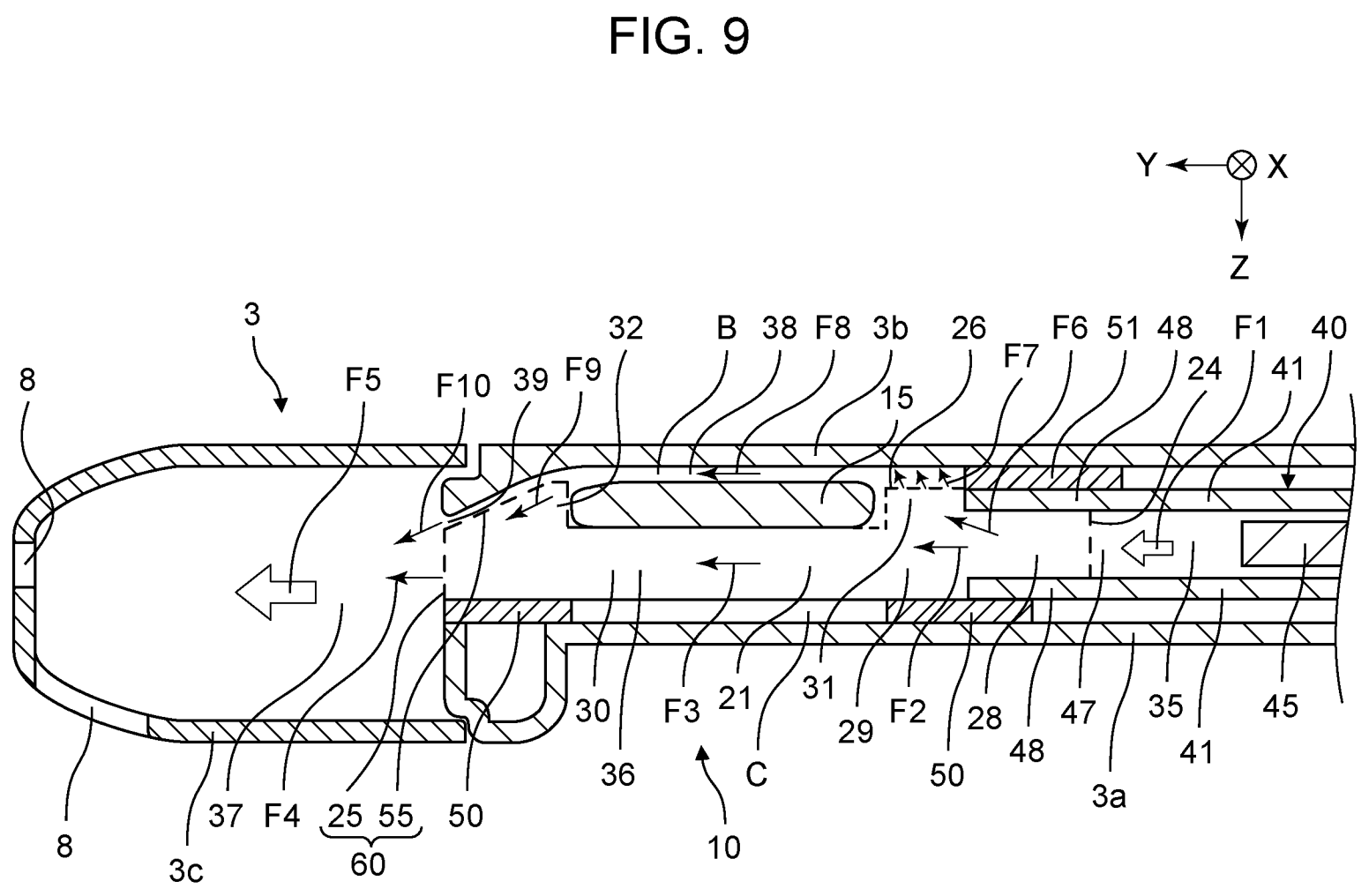

Heat dissipating structure 10 of the third exemplary embodiment will be described in detail with reference to FIG. 9. FIG. 9 is a schematic longitudinal cross-sectional view explaining heat dissipating structure 10 of the third exemplary embodiment according to the present disclosure. In FIG. 9, heat dissipation inlet 24, heat dissipation outlet 25, branch inlet 26, and additional outlet 55 are indicated by dotted lines. These dotted line parts indicate that air can circulate. An arrow in FIG. 9 schematically indicates a flow of air such as first blow F1. Heat dissipating structure 10 of the third exemplary embodiment is different from heat dissipating structure 10 of the first exemplary embodiment in that each of intermediate part 29 and straight part 30 of fin 21 in heat dissipator 20 has branch expansion 31 and outlet expansion 32 each protruding so as to approach second lower housing 3b, and each of branch expansion 31 and outlet expansion 32 has branch inlet 26 and additional outlet 55.

Branch expansion 31 is formed on a side facing second lower housing 3b in intermediate part 29 of fin 21 in heat dissipator 20. Branch expansion 31 extends along the Y-Z plane and protrudes so as to approach second lower housing 3b. Branch inlet 26 is formed in branch expansion 31. Branch inlet 26 is formed by exposing fin 21 with the arrangement of second wall 23 partially omitted. After flowing in branch blow passage 38 through branch inlet 26, sixth blow F6 circulates through branch blow passage 38 as seventh blow F7.

Outlet expansion 32 is formed at a terminal on a side of exhaust port 8 in straight part 30 of fin 21 in heat dissipator 20 and on a side facing second lower housing 3b. Outlet expansion 32 extends along the Y-Z plane and protrudes so as to approach second lower housing 3b. Additional outlet 55 is formed in outlet expansion 32. Additional outlet 55 is formed by exposing fin 21 with the arrangement of second wall 23 partially omitted. Additional outlet 55 communicates with heat dissipation outlet 25 to form junction outlet 60 integrally opening. Ninth blow F9 flows in heat dissipating blow passage 36 through additional outlet 55, and then flows out to outlet blow passage 37 through branch outlet 39 and junction outlet 60.

Since intermediate part 29 of fin 21 in heat dissipator 20 has branch expansion 31, the surface area of intermediate part 29 increases, and therefore heat dissipation in intermediate part 29 is improved. Since straight part 30 of fin 21 in heat dissipator 20 has outlet expansion 32, the surface area of straight part 30 increases, and therefore the heat dissipation in straight part 30 is improved. Therefore, in heat dissipating structure 10 of the third exemplary embodiment, heat transmission to second lower housing 3b is suppressed by branch blow passage 38, and the heat dissipation of heat dissipator 20 is improved by branch expansion 31 and outlet expansion 32.

[Effects]

According to heat dissipating structure 10 of the present exemplary embodiment, the following effects can be achieved.

Heat dissipating structure 10 is heat dissipating structure 10 provided inside housing 3, and includes blower 40, heat dissipator 20, heat transmitter 15, and branch blow passage 38. Blower 40 blows air. Heat dissipator 20 has heat dissipating blow passage 36 through which air from blower 40 flows. Heat transmitter 15 is arranged on heat dissipator 20 and transmits heat generated by heat source 11 to heat dissipator 20. Branch blow passage 38 is provided between housing 3 and heat transmitter 15 and branches from heat dissipating blow passage 36. Branch inlet 26 branching from heat dissipating blow passage 36 to branch blow passage 38 is formed on the side of blower 40 relative to heat transmitter 15 in heat dissipator 20.

Such configuration can suppress heat transmission to housing 3.

In heat dissipating structure 10 of the present exemplary embodiment, heat dissipating structure 10 further includes branch regulator 51 regulating the flow of air flowing through branch blow passage 38 on the side of blower 40 of branch inlet 26.

Such configuration can regulate backflow of air in housing 3.

In heat dissipating structure 10 of the present exemplary embodiment, branch regulator 51 has a heat insulating property.

Such configuration can suppress heat transmission through branch regulator 51.

In heat dissipating structure 10 of the present exemplary embodiment, heat dissipator 20 includes the plurality of fins 21 arranged apart from one another in a direction intersecting with an extending direction of heat dissipating blow passage 36. The plurality of fins 21 at branch inlet 26 have an inclined shape where a space with respect to housing 3 gradually increases from the side of blower 40 to the opposite side of blower 40.

Such configuration expands a branch space at branch inlet 26, and thus it becomes easy to guide air to branch blow passage 38.

In heat dissipating structure 10 of the present exemplary embodiment, opposite-side gap C is formed between second upper housing 3a and heat dissipator 20 on the side opposite to the side where heat transmitter 15 is arranged. Heat dissipating structure 10 further includes opposite-side regulator 50 regulating the flow of air flowing through opposite-side gap C.

Such configuration can regulate backflow of air in housing 3.

Electronic device 1 of the present exemplary embodiment includes heat dissipating structure 10 described above.

Such configuration can suppress heat transmission to housing 3 in electronic device 1.

The above exemplary embodiment has been described with an example of the CPU as heat source 11 that generates heat during operation. However, heat source 11 is not limited to the CPU, and may be, for example, a graphics processing unit (GPU), a rechargeable battery, or the like, corresponding to various devices that dissipates generated heat to the outside of housing 2 and housing 3.

In the above exemplary embodiments, a laptop computer (notebook PC) has been described as an example of electronic device 1. However, electronic device 1 is not limited to such laptop computer (notebook PC), and may be, for example, a tablet personal computer, various portable devices such as a mobile phone, a handheld game, a small television receiver, a disk drive, and a navigation system, and a stationary device such as a desktop personal computer and a liquid crystal projector.

In the above exemplary embodiments, an aspect where heat transmitter 15 is arranged on heat dissipator 20 and branch blow passage 38 is further provided on heat transmitter 15 is exemplified, but an aspect where heat transmitter 15 is arranged below heat dissipator 20 and branch blow passage 38 is further provided below heat transmitter 15 may be adopted.

Although the present disclosure has been fully described in connection with preferable exemplary embodiments with reference to the accompanying drawings, various variations and modifications are obvious to those skilled in the art. Such variations and modifications are to be understood as being included within the scope of the present disclosure as set forth in the appended scope of claims unless departing from the scope of the present disclosure.

The present disclosure is useful for a heat dissipating structure arranged in an electronic device such as a laptop computer (notebook PC).

What is claimed is:

1. A heat dissipating structure provided inside a housing, the heat dissipating structure comprising:

a blower that blows air;

a heat dissipator including a heat dissipating blow passage through which the air from the blower flows;

a heat transmitter arranged on the heat dissipator and transferring heat generated by a heat source to the heat dissipator; and a branch blow passage provided between the housing and the heat transmitter and branching from the heat dissipating blow passage, wherein the heat dissipating blow passage includes a branch inlet positioned between the heat transmitter and the blower, the branch blow passage branches from the branch inlet of the heat dissipating blow passage, the heat dissipator further includes a plurality of fins arranged apart from one another in a direction intersecting with an extending direction of the heat dissipating blow passage, and the plurality of fins at the branch inlet have an inclined shape where a space between the plurality of fins and the housing gradually increases from the blower toward the heat transmitter.

2. The heat dissipating structure according to claim 1, further comprising a branch regulator arranged between the branch inlet and the blower and regulating a flow of the air flowing through the branch blow passage.

3. The heat dissipating structure according to claim 2, wherein the branch regulator has a heat insulating property.

4. The heat dissipating structure according to claim 3, wherein the branch regulator includes a sponge made of melanin resin.

5. The heat dissipating structure according to claim 1, wherein the plurality of fins include a first fin and a second fin adjacent to each other, and a distance between the first fin and the second fin is smaller than a distance between the housing and the heat transmitter.

6. The heat dissipating structure according to claim 1, wherein the heat dissipator further includes a wall arranged between the plurality of fins and the heat transmitter.

7. The heat dissipating structure according to claim 1, further comprising:

an opposite-side gap positioned between the housing and the heat dissipator on an opposite side of the heat transmitter with respect to the heat dissipator; and an opposite-side regulator regulating a flow of the air flowing through the opposite-side gap.

8. An electronic device comprising:

the heat dissipating structure according to claim 1; and the housing.

* * * * *